United States Patent [19]

Welzhofer

[11] Patent Number: 4,607,214
[45] Date of Patent: Aug. 19, 1986

[54] ADAPTOR CIRCUIT FOR ADAPTING A TEST FACILITY TO A UNIT UNDER TEST HAVING A FAST SIGNAL RESPONSE

[75] Inventor: Klaus Welzhofer, Graefelfing, Fed. Rep. of Germany

[73] Assignee: Siemens Aktiengesellschaft, Berlin & Munich, Fed. Rep. of Germany

[21] Appl. No.: 487,062

[22] Filed: Apr. 21, 1983

[30] Foreign Application Priority Data

Apr. 22, 1982 [DE] Fed. Rep. of Germany ....... 3215074

[51] Int. Cl.⁴ .......................................... G01R 15/12
[52] U.S. Cl. .............................. 324/73 AT; 307/265; 307/475; 324/73 R; 324/158 R; 364/579
[58] Field of Search ............ 324/73 R, 73 AT, 158 T, 324/158 R, 158 D, 158 F, 158 SC; 307/265, 269, 475; 364/579, 580; 371/20, 21

[56] References Cited

U.S. PATENT DOCUMENTS

| | | | |
|---|---|---|---|
| 3,631,229 | 12/1971 | Bens | 324/73 R X |
| 3,775,624 | 11/1973 | Algeri et al. | 307/265 X |
| 3,974,402 | 8/1976 | Fett et al. | 307/475 |
| 4,027,261 | 5/1977 | Laurent et al. | 307/269 X |
| 4,044,244 | 8/1977 | Foreman et al. | 324/73 R X |
| 4,161,029 | 7/1979 | Frye et al. | 324/73 R X |
| 4,211,915 | 7/1980 | Miller et al. | 324/73 R X |
| 4,399,405 | 8/1983 | Welzhofer | 324/73 AT |
| 4,465,971 | 8/1984 | Abeyta | 307/475 X |

FOREIGN PATENT DOCUMENTS 2233612 1/1974 Fed. Rep. of Germany .
2951929 7/1981 Fed. Rep. of Germany .

Primary Examiner—Gerard R. Strecker
Assistant Examiner—Warren S. Edmonds
Attorney, Agent, or Firm—Hill, Van Santen, Steadman & Simpson

[57] ABSTRACT

Test signals emitted by a test facility A may have a chronological offset relative to a defined time point which is unacceptable for certain units under test having a fast response circuitry. A system is inserted between the test facility and such a unit under test so as to provide a smaller chronological offset. This system contains a transmitter and a receiver connected in antiparallel fashion with respect to one another. The transmitter connects the test signal of the test facility through to the unit under test as a test signal only when a clock signal and a change-over signal are present at the transmitter. The clock signal can be generated at a determinable point in time in a simple manner and thus the point in time of the appearance of the various test signals can be determined without a great offset from this point in time. The receiver is cut in with the assistance of a clock signal and by means of a cut-in signal, and then emits a result signal based on the signal from the unit under test to the test facility. The clock signal for the transmitter and the clock signal for the receiver are both obtained from a given clock signal with the assistance of time-delay means.

7 Claims, 5 Drawing Figures

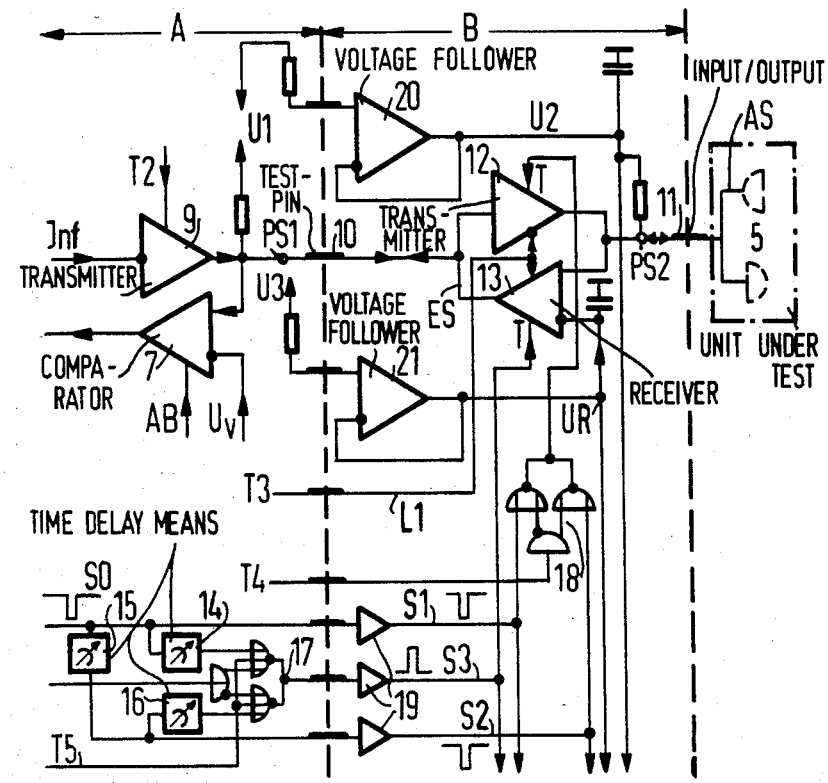
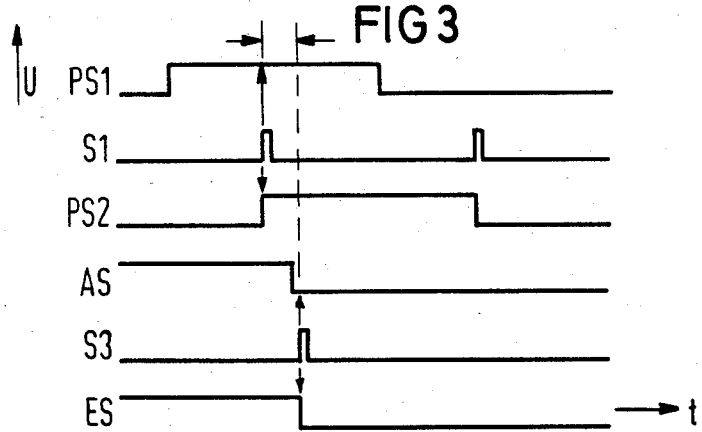

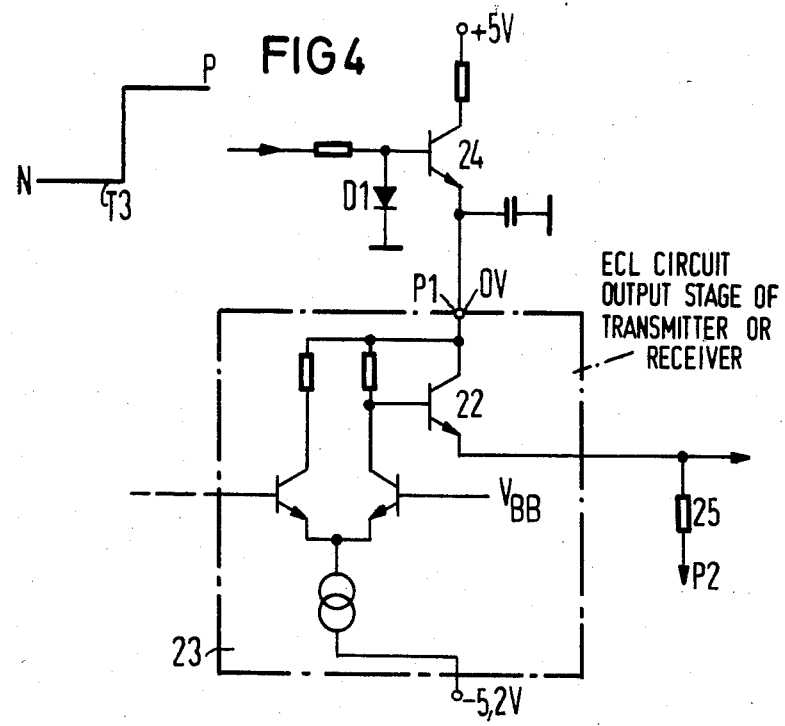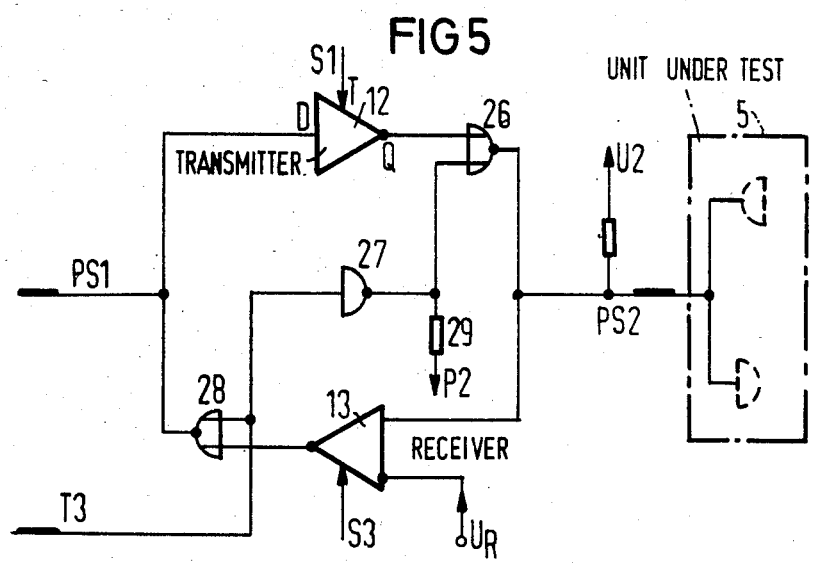

4,607,214

ADAPTOR CIRCUIT FOR ADAPTING A TEST FACILITY TO A UNIT UNDER TEST HAVING A FAST SIGNAL RESPONSE

BACKGROUND OF THE INVENTION

The invention relates to a test facility for testing the unit wherein signals are transmitted via input pins and response signals are received on output pins.

Such a test facility is known from U.S. Pat. No. 4,399,405, incorporated herein by reference, containing a transmitter and a receiver for each pin to be tested. The transmitter generates a test signal which is supplied to an input pin of a unit under test, for example a printed circuit board. In response thereto, the unit under test emits at another output pin a response signal which depends on the structure of the unit under test. The response signal is supplied to one of the receivers in the test facility which evaluates it. The test facility can have a plurality of transmitters, receivers, and test pins, with each test pin having one transmitter and one receiver allocated to it.

The test signals generated by the test facility for simultaneous input at input pins of the unit under test generally exhibit a chronological or timewise offset which depends on the the structure of the test facility. In other words, the plurality of test signals are not always generated at the same point in time, but rather their appearance fluctuates around a desired appearance time. When, for example, printed circuit boards which contain modules in TTL, MOS or ECL technology are tested with the assistance of such a test facility, the test facility must achieve a chronological offset of the test signals which is $\leq \pm 10$ ns. The test facility must be accordingly designed.

When such a test facility is to be employed for testing units under test which require a smaller chronological offset, for example $\leq \pm 100$ ps, then the overall test facility would have to be modified.

An object underlying the invention is to specify a system which adapts an existing test facility having a fixed, chronological or time-wise offset of the plurality of test signals input to a unit under test for which a smaller time offset of the test signals being input relative to a given time point is necessary while testing. Given an arrangement of the type initially specified, this object is achieved in that a transmitter and a receiver are connected in anti-parallel relationship with respect to one another between each of the test pins and the respective input/output of the unit under test, said transmitter and receiver being alternately engageable depending upon whether the test facility pin is an input or output. A second clock signal derived from a first clock signal can be applied to the transmitter. It is used to control a connection through of the test signal at the input of the transmitter to its output. A third clock signal can be applied to the receiver. It is used to control a connection through of the response signal at the input to the output thereof given upward movement of a reference voltage. A time-lag circuit is provided to which a first clock signal is supplied and which generates the second and the third clock signals at an adjustable chronological interval.

When the transmitter or receiver of the arrangement are constructed in ECL technology, then the cut-in arrangement for the receiver or transmitter can consist of a transistor whose emitter is connected to the operating potential terminal of the output stage of the sender/receiver, whose base terminal lies at a first fixed potential over a diode, and to which a control voltage between the first potential and a potential switching the transistor conductive is supplied.

In order to achieve a tri-state character for the receiver/transmitter, the output stage constructed as an emitter follower is connected to a second fixed potential over a resistor.

A further cut-in arrangement for the transmitter/receiver can comprise a respective NOR element connected to the output of the transmitter and receiver, a change-over signal being supplied to its other input either directly or over an inverter. The tri-state character can be achieved in that the other input of the NOR element following the transmitter is connected to a fixed potential over a resistor.

BRIEF DESCRIPTION OF THE DRAWINGS

FIG. 2 illustrates the inventive arrangement positioned between the test facility and the unit under test;

FIG. 3 shows a pulse diagram (voltages U entered over the time T);

FIG. 4 illustrates a first arrangement for the cut-in of the transmitter or receiver; and FIG. 5 shows a further arrangement for the cut-in of the receiver or transmitter.

DESCRIPTION OF THE PREFERRED EMBODIMENT

Figure 1:
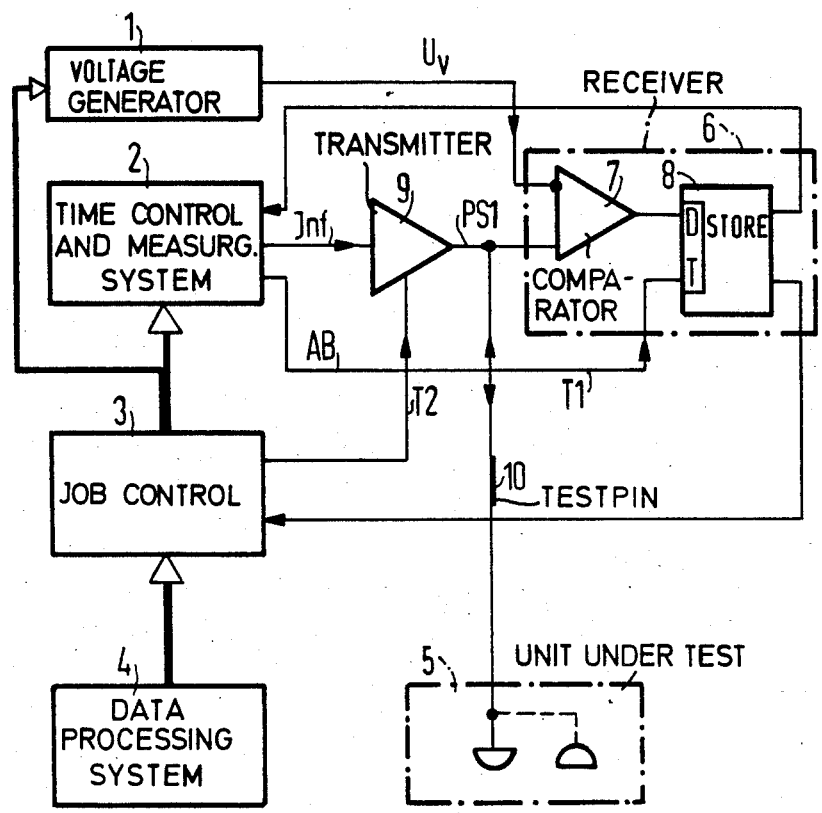
FIG. 1 is a block diagram of the test facility.

A data processing system 4 incluences a job control 3 which in turn influences both a time control and measuring system 2 as well as a voltage generator 1. The voltage generator 1 supplies a comparison voltage UV for a receiver 6 which comprises a comparator 7 and a store 8, for example a D-flip-flop in FIG. 1. The outputs of the receiver 6 are connected to the time control and measuring system 2 and to the job control 3. The time control and measuring system 2 also supplies a sampling clock AB to the store 8. Further contained in the test facility is a transmitter 9 which generates the test signals for one of the inputs of a unit under test 5. For this purpose, information INF is supplied to the transmitter 9 by the time control and measuring system 2. From this information INF, the transmitter 9 generates the test signals PS1 at its output as a function of a clock signal T2. The output of the transmitter 9 and the input of the receiver 6 are connected to a test pin 10. The unit under test 5 is connected to the test pin 10. The unit under test 5 is thus connected to the test facility over a bi-directional line.

A plurality of transmitters 9 each emit a respective test signal PS1 whose leading edge for example, as a function of the structure of the test facility, exhibits a chronological or timewise offset of, for example, $\leq \pm 10$ ns relative to a desired time point. When a unit under test which requires test signals having a small chronological offset is to be tested with this test facility, then an arrangement must be inserted between the test facility and the unit under test 5 which adapts the chronological offset of the test signals of the test facility to the unit under test. Such as arrangement derives from FIG. 2. Inserted here between the test pin 10 and the unit under test 5 is an arrangement B which adapts the chronological offset of the test signals PS1 for use with the unit under test 5 (it requires a smaller offset). This arrangement lies between the output of the test facility A and the unit under test 5. First test signals PS1 are supplied by the test facility A to the arrangement B over a plurality of test pins 10. The arrangement B generates second test signals PS2 from the first test signals PS1, the chronological offset of edges of the second test signals PS2 relative to a given time point having the desired value. These test signals PS2 proceed over a plurality of second test pins 11 to which the unit under test 5 is connected.

The plurality of response signals AS emitted by the unit under test 5 in response to the second test signals PS2 likewise proceed over a plurality of test pins 11 to the arrangement B which evaluates the response signals. A plurality of result signals ES are then supplied by the arrangement B over a plurality of test pins 10 of the test facility A.

In the sample embodiment of FIG. 2, the output stage of the test facility A is comprised of a transmitter 9 and a receiver 7 of a known structure for each test pin. Their structure derives, for example, from German OS No. 29 51 929, incorporated herein by reference.

The system B of the invention likewise contains a transmitter 12 and a receiver 13 for each test pin. The transmitter 12 and the receiver 13 are connected in anti-parallel fashion with respect to one another, and can be alternately engaged. For this purpose, a change-over signal T3 is supplied to the transmitter 12 or receiver 13 over a line L1. It is supplied directly or inverted.

The generation of the second test signals PS2 by the arrangement B occurs in the following manner. When the test signals are to be generated, then the transmitter 12 is switched on by the change-over signal P3. The first test signal PS1 is applied to the transmitter 12 (see FIG. 3). The first test signal is connected through to the output of the transmitter 12 with the assistance of a clock signal S1 (FIG. 3). The corresponding second test signal PS2 therefore appears at the output of the transmitter 12 at the point in time of the appearance of the clock signal S1. The clock signal S1 thus fixes the point in time of the appearance of the second test signal PS2 and likewise determines a reduced chronological offset of the second test signals PS2 with respect to said point in time.

On the basis of the second test signal PS2, the unit under test 5 generates a response AS at a different, second or output test pin. For evaluation purposes, the transmitter 12 is disconnected at the other output or, second test pin and the receiver 13 is turned on with the change-over signal T3. The response signal AS is compared to a reference voltage UR by the receiver 13. The result signal ES deriving from the comparison, however, is only connected through to the output of the receiver 13 when a clock signal S3 is adjacent to the receiver 13. The result signal ES is supplied over the test pin 10 to the test facility A.

Both the transmitter 12 as well as the receiver 13 are constructed in accordance with the comparator 7 and the store 8 of FIG. 1. The second test signal or the result signal only appear at the output of the store 8 when the corresponding clock signal S1 or S3 has been supplied to the store 8 (at input T).

The clock signals S1, S3 can be gained from a clock signal S0 with the assistance of time-lag devices. Such time-lag devices can, for example, be delay lines. The clock signal S0 is employed, for example, directly as clock signal S1. Another clock signal S2 can be generated in addition to the clock signal S1, the additional clock signal S2 being likewise supplied to the transmitter 12. For this purpose, the clock signal S0 is conducted over a time-lag means 15 and is employed as clock signal S2. With the assistance of a change-over means 18, either the clock signal S1 or the clock signal S2 can be applied to the transmitter 12. The clock signal S3 can be directly obtained from the clock signal S0 when the clock signal S0 is conducted across a time-delay means 14; however, it can also be obtained from the clock signal S2 when this signal is conducted across a time-delay means 16. Either the output signal of the time-delay means 14 or the output signal of the time-delay means 16 can be employed with the assistance of a change-over means 17 as clock signal S3. Respective pulse shaping stages 19 which lend the clock signals S1 through S3 the desired shape are disposed at the output of the time-delay means.

The operating potentials required for operating the arrangement B are taken from the test facility A. For this purpose, the operating voltage U1 of the test facility A is, for example, converted over a voltage follower 20 into the operating voltage U2 which is required for operating the arrangement B. The reference voltage UR is likewise obtained from an operating voltage U3 of the test facility over a voltage follower 21.

The chronological spacing of the occurrence of the clock signals S1/S2 and S3 is fixed with the assistance of the time-delay means 14 through 16. When the delay time of the time-delay means 14 through 16 is variable, i.e. delay lines having a plurality of taps for example are employed, the chronological spacing of the appearance of the clock signals S1/S2 and S3 can be correspondingly varied.

Whether the clock signal S1 or the clock signal S2 is connected to the transmitter 12 can be determined with the assistance of a clock signal T4 which is supplied by the test facility A. Whether the clock signal S3 is directly obtained from the clock signal S0 or is obtained from the clock signal S2 can be determined with the assistance of a clock signal T5 from the test facility A.

Either the transmitter 12 or the receiver 13 can be switched on with the assistance of a change-over signal T3 on the line L1. This can ensue with the assistance of a circuit arrangement according to FIG. 4 or FIG. 5.

A pre-condition given the circuit arrangement according to FIG. 4 is that the output stage of the transmitter 12 or, respectively, receiver 13 is constructed in ECL technology. Such an ECL output stage of a known structure is illustrated in the dot-dash space of FIG. 4. This output stage contains an emitter follower 22. The ECL circuit 23 is cinnected to the emitter follower 22 in a known manner. A fixed potential P1 of zero volts for example is required for operating the ECL circuit. When the ECL circuit 23 is to be shut off, then the potential P1 is lowered to −0.8 V, for example. This reduction is achieved by means of a transistor 24 which is connected in the emitter circuitry. The emitter of the transistor 24 is thus connected to the terminal for the operating potential P1 of the ECL circuit 23. The base terminal of the transistor 24 is connected over a diode D1 to the operating potential at point P1, for example zero volts, on the one hand and, on the other hand, a control voltage T3 is supplied to it. When this has its value P of, for example 4 V, then the diode D1 is turned on and a voltage of approximately 0.8 V is present at the base of the transistor 24. 0 V is then present at the emitter of the transistor 24 and the ECL circuit 23 receives the proper operating potential. When the control voltage T3, however, has a value N, for example 0 V, then approximately −0.8 V is present at the emitter of the transistor and the ECL circuit 23 is inhibited. A voltage determined by a resistor 25 and an operating potential P2 is then present at the output of the emitter follower 22. Thus, the circuit according to FIG. 4 has a tri-state character.

FIG. 5 shows another circuit arrangement with which one can switch between the transmitter 12 and the receiver 13. A respective NOR element 26 or 28 is disposed at the output of the transmitter 12 or receiver 13. The change-over signal T3 is directly connected to the NOR element 28, and in contrast thereto, is connected to the NOR element 26 via the inverter 27. The output of the inverter 27 or the corresponding input of the NOR element 26 is also connected over a resistor 29 to a potential P2. Either the transmitter 12 or the receiver 13 can be switched on with the assistance of the NOR elements 26, 28 and the inverter 27. The tri-state character can be achieved at the output of the transmitter 2 with the additional assistance of the resistor 29 and of the operating potential P2.

Although various changes and modifications might be proposed by those skilled in the art, it will be understood that I wish to include within the claims of the patent warranted hereon all such changes and modifications as reasonably come within my contribution to the art.

I claim:

1. A system for adapting a test facility to a unit test comprising:
    adapter means for providing a chronological offset of test signals relative to a given time point supplied to the unit under test which is smaller than a chronological offset of the test signals relative to a given time point actually generated by the test facility without the adapter means; said adapter means including:
        a plurality of first test pins connecting to respective input/output pins of the test facility and a plurality of second test pins connecting to respective input/output pins of the unit under test;
        a transmitter and receiver connected in anti-parallel relationship to one another and between each of the first test pins and one of the respective second test pins;
        a first clock signal to which a time-delay means is connected for generating second and third clock signals at variable time intervals relative to the first clock signals, means for applying the second clock signal to all of the transmitters so that when it appears, it connects through a respective test signal at an input of the transmitter to an output thereof so as to form an output test signal, means for applying the third clock signal to all of the receivers, each of said receivers including means for comparing a response signal at a respective second input/output test pin created by the unit under test to a reference voltage in creating a result signal given a favorable comparison; and
said means for applying a third clock signal causing said respective receiver to connect through the result signal to the test facility.

2. A system according to claim 1 wherein the means for alternately engaging is comprised of a transistor whose emitter is connected to an operating potential terminal fo an output stage of the transmitter or receiver, whose base terminal is connected to a first fixed potential over a diode, and the base terminal also being connected to a change-over control voltage signal changeable between the first potential and a switching TTL-potential for the transistor.

3. A system according to claim 2 wherein the output stage of the transmitter or receiver has an emitter follower connected over a resistor to a fixed potential.

4. A system according to claim 1 wherein a first input of a first NOR element is connected to an output of the transmitter and a first input of a second NOR element is connected to an output of the receiver, a second input of the second NOR element having a change-over signal applied thereto and a second input of the first NOR element having an inversion of a control voltage change-over signal applied thereto.

5. A system according to claim 4 wherein the first NOR element second input is connected over a resistor to a fixed potential and also an inverter output whose input connects to the second NOR element second input.

6. A system according to claim 5 wherein an output of the first NOR element connects to an input of the receiver and also to the respective second test pin, and an output of the second NOR element connects to an input of the transmitter.

7. A system for adapting a test facility to a unit under test comprising:
    adapter means for providing a time-wise offset of test signals relative to a given time point supplied to the unit under test which is smaller than a time-wise offset of the test signals relative to a given time point actually generated by the test facility without the adapter means, said adapter means including:
        a pluality of first test pins connecting to respective input/output pins of the test facility and a plurality of second test pins connecting to respective input/output pins of the unit under test;
        a transmitter and receiver connected between each of the first test pins and each of the respective second test pins;
        a first clock signal to which a time-delay means is connected for generating second and third clock signals at variable time intervals relative to the first clock signal, means for applying the second clock signal to all of the transmitters so that when it appears, it connects through a respective test signal at an input of the transmitter to an output thereof so as to form an output test signal, and means for applying the third clock signal to all of the receivers for connecting through a signal responsive to a response signal at a respective second input/output test pin created by the unit under test.

* * * * *